United States Patent
Yantchev (10) Patent No.: US 10,992,284 B2
(45) Date of Patent: Apr. 27, 2021

(54) FILTER USING TRANSVERSELY-EXCITED FILM BULK ACOUSTIC RESONATORS WITH MULTIPLE FREQUENCY SETTING LAYERS

(71) Applicant: Resonant Inc., Goleta, CA (US)

(72) Inventor: Ventsislav Yantchev, Sofia (BG)

(73) Assignee: Resonant Inc., Austin, TX (US)

( * ) Notice: Subject to any disclaimer, the term of this patent is extended or adjusted under 35 U.S.C. 154(b) by 0 days.

(21) Appl. No.: 16/924,108

(22) Filed: Jul. 8, 2020

(65) Prior Publication Data
US 2020/0343877 A1 Oct. 29, 2020

Related U.S. Application Data (63) Continuation-in-part of application No. 16/689,707, filed on Nov. 20, 2019, which is a continuation of
(Continued)

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02015* (2013.01); *H03H 9/02031* (2013.01);
(Continued)

(58) Field of Classification Search
CPC .......... H03H 9/02015; H03H 9/02228; H03H 9/02031; H03H 9/02039; H03H 9/02062;
(Continued)

(56) References Cited

U.S. PATENT DOCUMENTS 6,540,827 B1 4/2003 Levy et al.
7,463,118 B2 12/2008 Jacobsen
(Continued)

FOREIGN PATENT DOCUMENTS

WO 2016017104 2/2016
WO 2018003273 A1 1/2018

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Barbara Summons
(74) *Attorney, Agent, or Firm* — SoCAL IP Law Group LLP; John E. Gunther (57) ABSTRACT

Acoustic filters and methods are disclosed. A single-crystal piezoelectric is attached to a substrate, portions of the piezoelectric plate forming one or more diaphragms spanning respective cavities in the substrate. A conductor pattern is formed on the piezoelectric plate, the conductor pattern including a plurality of interdigital transducers (IDTs) of a plurality of resonators, interleaved fingers of each of the plurality of IDTs disposed on a respective diaphragm of the one or more diaphragms. A first frequency setting dielectric layer having a first thickness is disposed over the fingers of the IDTs of a first subset of the plurality of resonators. A second frequency setting dielectric layer having a second thickness greater than the first thickness is disposed over the fingers of the IDTs of a second subset of the plurality of resonators, wherein the first subset and the second subset are not identical.

18 Claims, 9 Drawing Sheets

Related U.S. Application Data application No. 16/230,443, filed on Dec. 21, 2018, now Pat. No. 10,491,192.

(60) Provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
    *H03H 9/13*      (2006.01)
    *H03H 9/17*      (2006.01)
    *H03H 3/02*      (2006.01)
    *H01L 41/047*      (2006.01)

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H01L 41/0477* (2013.01); *H03H 3/02* (2013.01); *H03H 9/02039* (2013.01); *H03H 2003/023* (2013.01)

(58) Field of Classification Search
CPC ........ H03H 9/132; H03H 9/174; H03H 9/176; H03H 9/562; H03H 9/564; H03H 9/568; H03H 3/02; H03H 2003/023; H01L 41/0477
USPC .......................................... 333/186, 187, 189
See application file for complete search history.

(56) References Cited

U.S. PATENT DOCUMENTS

| | | | |
|---|---|---|---|
| 7,535,152 B2 | 5/2009 | Ogami et al. | |
| 7,684,109 B2 | 3/2010 | Godshalk et al. | |
| 7,868,519 B2 | 1/2011 | Umeda | |
| 8,278,802 B1 | 10/2012 | Lee et al. | |
| 8,829,766 B2 | 9/2014 | Milyutin et al. | |
| 8,932,686 B2 | 1/2015 | Hayakawa et al. | |
| 9,219,466 B2 | 12/2015 | Meltaus et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,780,759 B2 | 10/2017 | Kimura et al. | |
| 10,637,438 B2 * | 4/2020 | Garcia | H03H 9/171 |
| 10,756,697 B2 * | 8/2020 | Plesski | H03H 9/564 |
| 10,826,462 B2 * | 11/2020 | Plesski | H03H 9/02228 |
| 10,868,512 B2 * | 12/2020 | Garcia | H03H 9/568 |
| 2002/0158714 A1 | 10/2002 | Kaitila et al. | |
| 2004/0261250 A1 | 12/2004 | Kadota et al. | |
| 2011/0109196 A1 | 5/2011 | Goto | |
| 2013/0234805 A1 | 9/2013 | Takahashi | |
| 2014/0145556 A1 | 5/2014 | Kadota | |
| 2014/0151151 A1 | 6/2014 | Reinhardt | |
| 2015/0319537 A1 | 11/2015 | Perois et al. | |
| 2015/0333730 A1 | 11/2015 | Meltaus | |
| 2016/0182009 A1 | 6/2016 | Bhattacharjee | |
| 2017/0063332 A1 | 3/2017 | Gilbert et al. | |
| 2017/0179928 A1 | 6/2017 | Raihn et al. | |
| 2017/0214387 A1 | 7/2017 | Burak et al. | |
| 2017/0222622 A1 | 8/2017 | Solal et al. | |
| 2019/0068164 A1 | 2/2019 | Houlden et al. | |
| 2019/0131953 A1 | 5/2019 | Gong | |
| 2019/0273480 A1 | 9/2019 | Lin | |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High Fom of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

* cited by examiner

FILTER USING TRANSVERSELY-EXCITED FILM BULK ACOUSTIC RESONATORS WITH MULTIPLE FREQUENCY SETTING LAYERS

RELATED APPLICATION INFORMATION

This patent is a continuation-in-part of application Ser. No. 16/689,707, filed Nov. 20, 2019, entitled BANDPASS FILTER WITH FREQUENCY SEPARATION BETWEEN SHUNT AND SERIES RESONATORS SET BY DIELECTRIC LAYER THICKNESS, now U.S. Pat. No. 10,917,070, which is a continuation of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
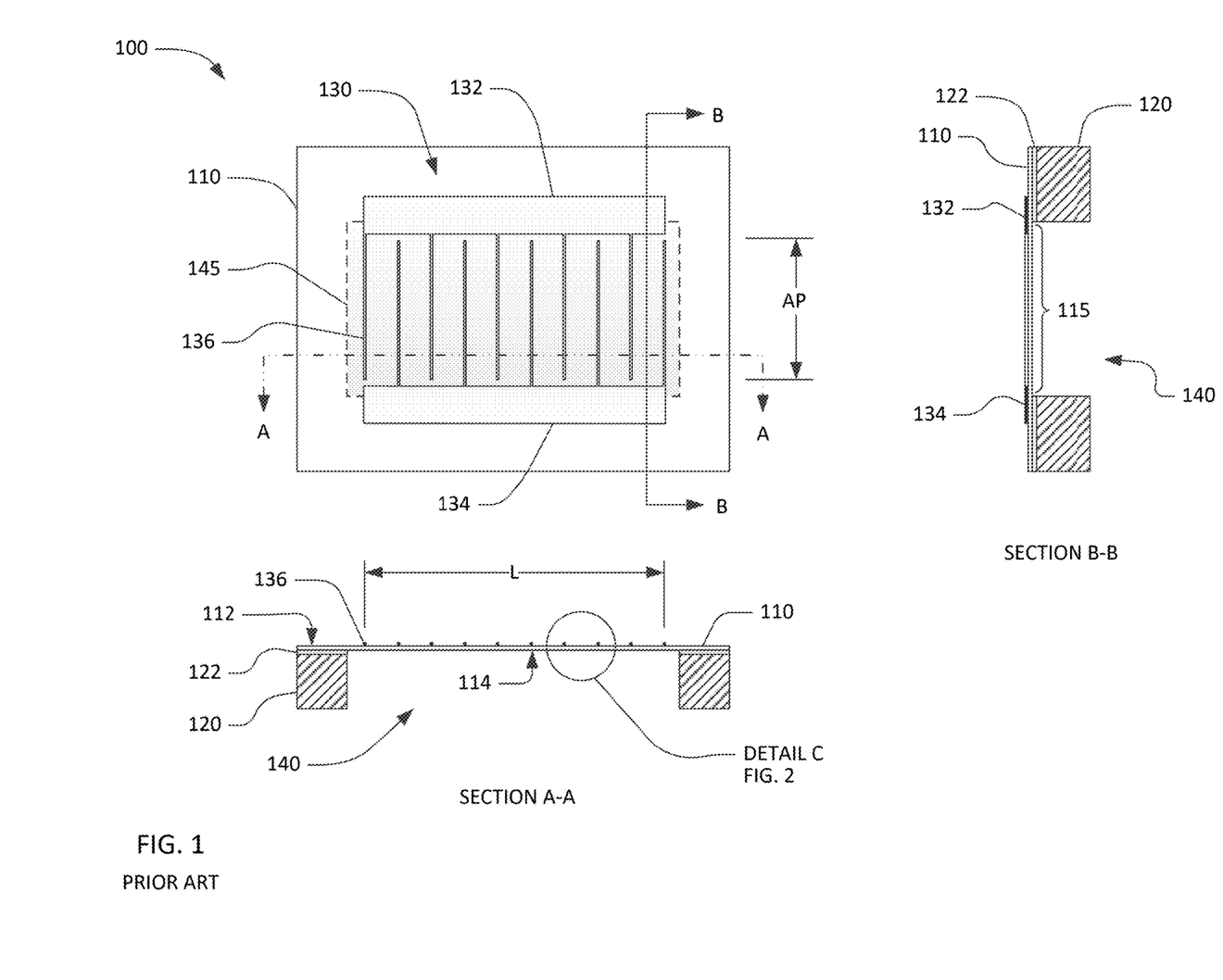
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the front and back surfaces 112, 114. However, XBARs may be fabricated on piezoelectric plates with other crystallographic orientations including rotated Z-cut and rotated Y-cut.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers.

"Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A and FIG. 3B). The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
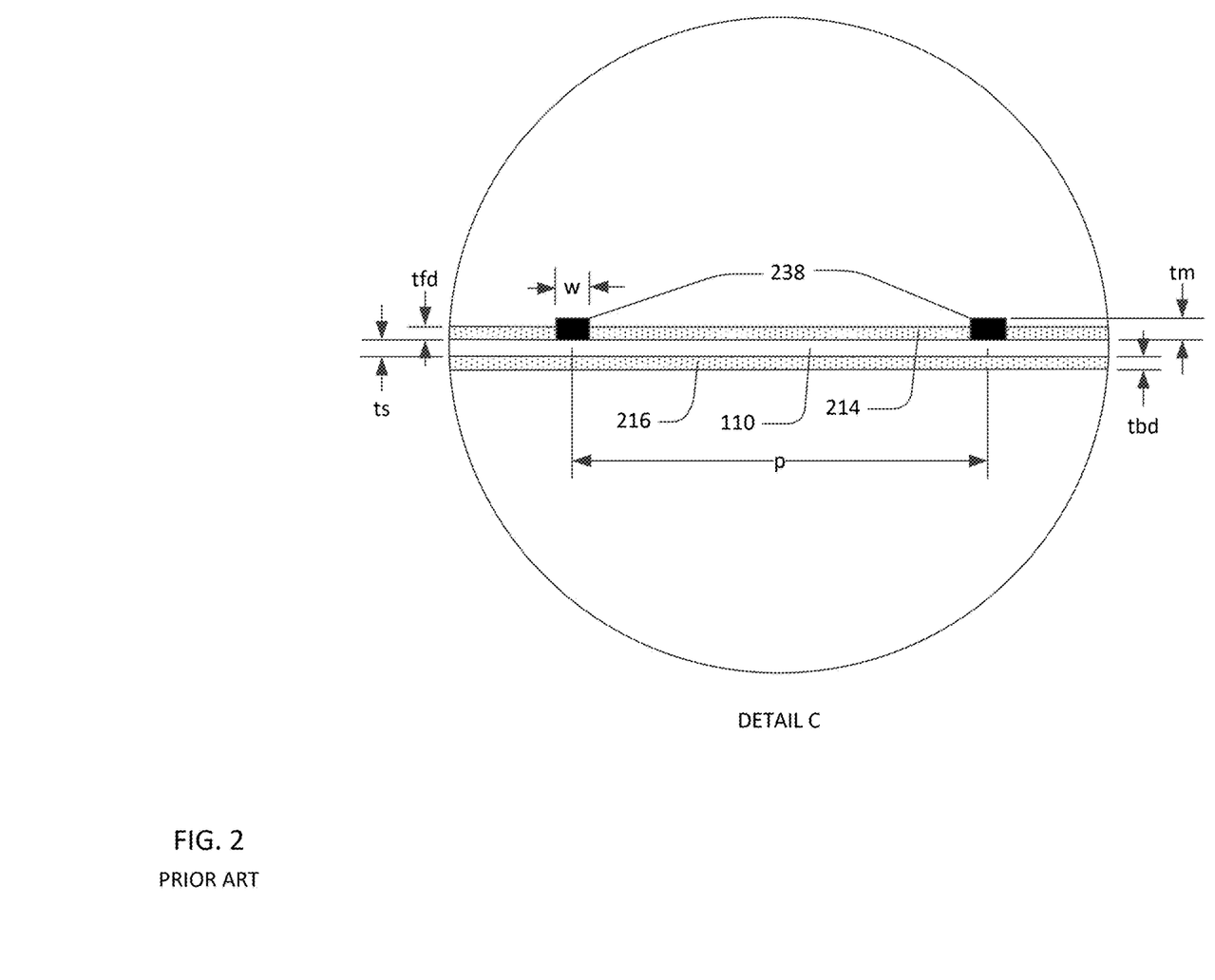
FIG. 2 is an expanded schematic cross-sectional view of a portion of the XBAR of FIG. 1.

FIG. 2 shows a detailed schematic cross-sectional view of detail C of the XBAR 100 of FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum, a substantially aluminum alloys, copper, a substantially copper alloys, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 110. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
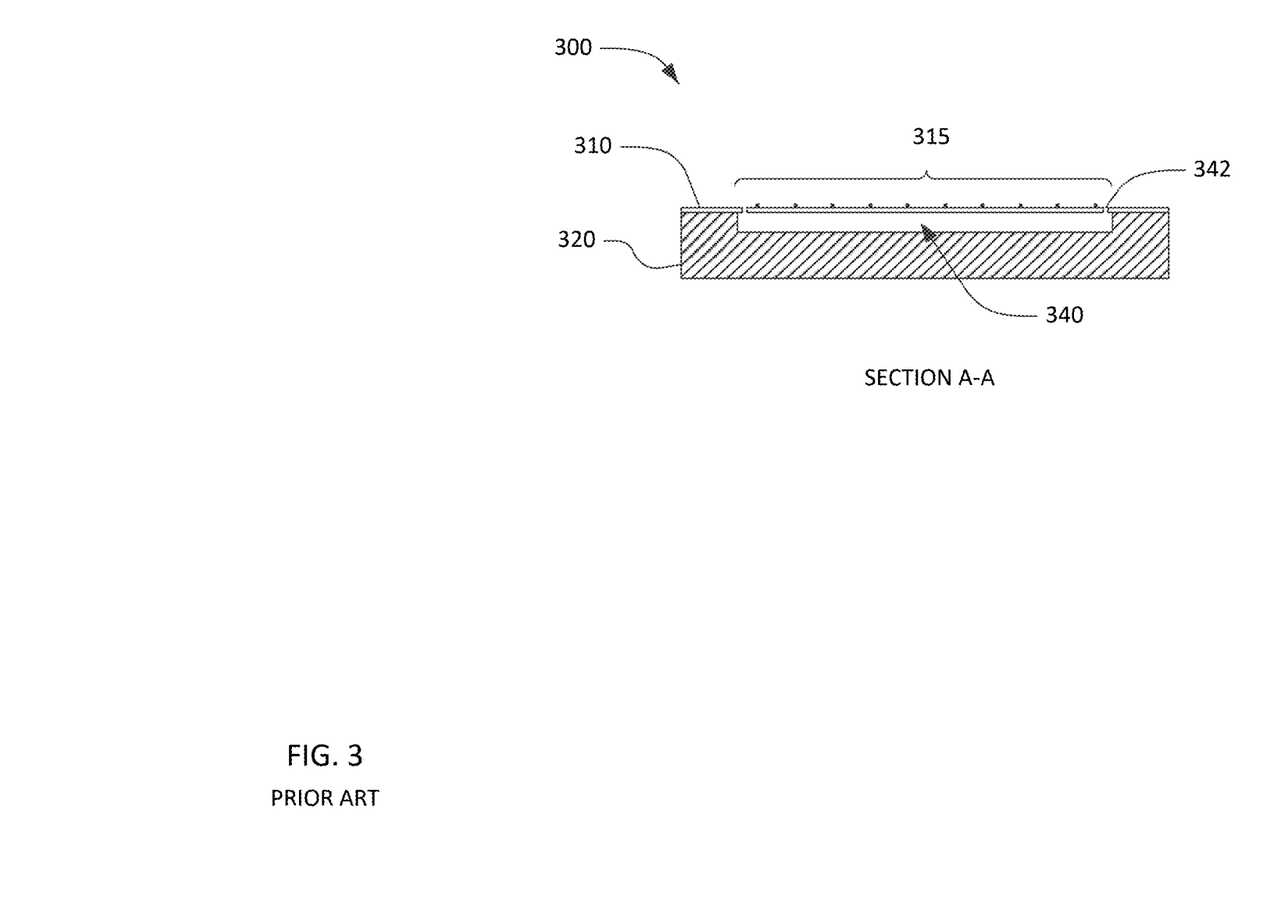
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

Figure 4:
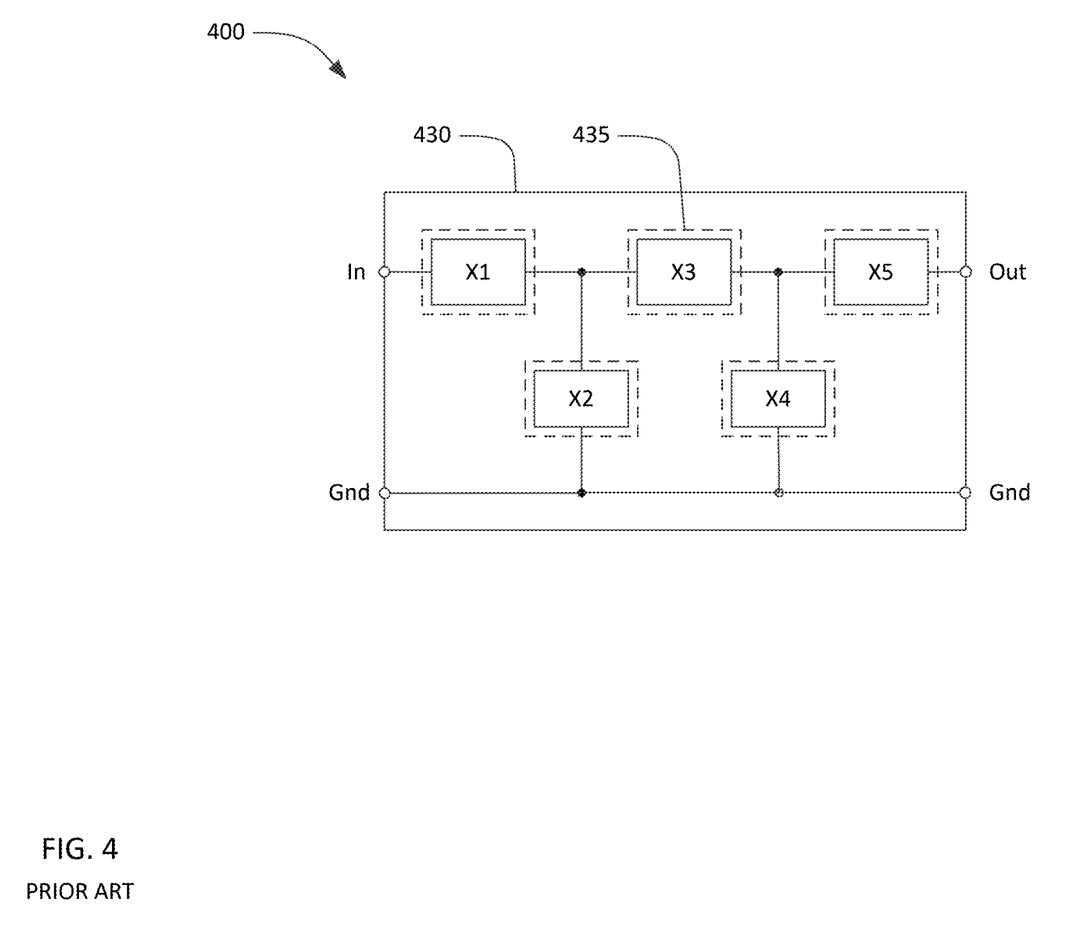
FIG. 4 is a schematic circuit diagram of a bandpass filter using acoustic resonators.

FIG. 4 is a schematic circuit diagram of a band-pass filter 400 using five XBARs X1-X5. The filter 400 may be, for example, a band-pass filter for use in a communication device. The filter 400 has a conventional ladder filter architecture including three series resonators X1, X3, X5 and two shunt resonators X2, X4. The three series resonators X1, X3, X5 are connected in series between a first port and a second port. In FIG. 4, the first and second ports are labeled "In" and "Out", respectively. However, the filter 400 is bidirectional and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 400 maybe formed on a single plate 430 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 4, the perimeters of the cavities are illustrated schematically as the dashed rectangles (such as the rectangle 435). In this example, an IDT of each resonator is disposed over a respective cavity. In other filters, the IDTs of two or more resonators may be disposed over a common cavity.

Each of the resonators X1 to X5 has a resonance frequency and an anti-resonance frequency. In over-simplified terms, each resonator is effectively a short circuit at its resonance frequency and effectively an open circuit at its anti-resonance frequency. Each resonator X1 to X5 creates a "transmission zero", where the transmission between the in and out ports is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, resonance frequencies of the shunt resonators are below the passband and the anti-resonance frequencies of the shunt resonators are within the passband. Resonance frequencies of the series resonators are within the passband and the anti-resonance frequencies of the series resonators are above the passband.

The resonance frequency of an XBAR is determined by the thickness of the diaphragm, including the piezoelectric plate and any dielectric layers, and the pitch of the IDT fingers. The thickness of the diaphragm is the dominant parameter and the tuning range provided by varying the pitch is limited. For broad bandwidth filters, the tuning range provided by varying the pitch may be insufficient to provide the necessary separation between the resonance frequencies of the shunt and series resonators. U.S. Pat. No. 10,491,192 describes the use of a dielectric frequency setting layer formed only over shunt resonators to increase the frequency separation between the shunt and series resonators. Some filters, such as filters requiring a wide stopband on one or both sides of the passband, require significant separation of the resonance frequencies of the shunt resonators and/or the anti-resonance frequencies of the series resonators.

Figure 5:
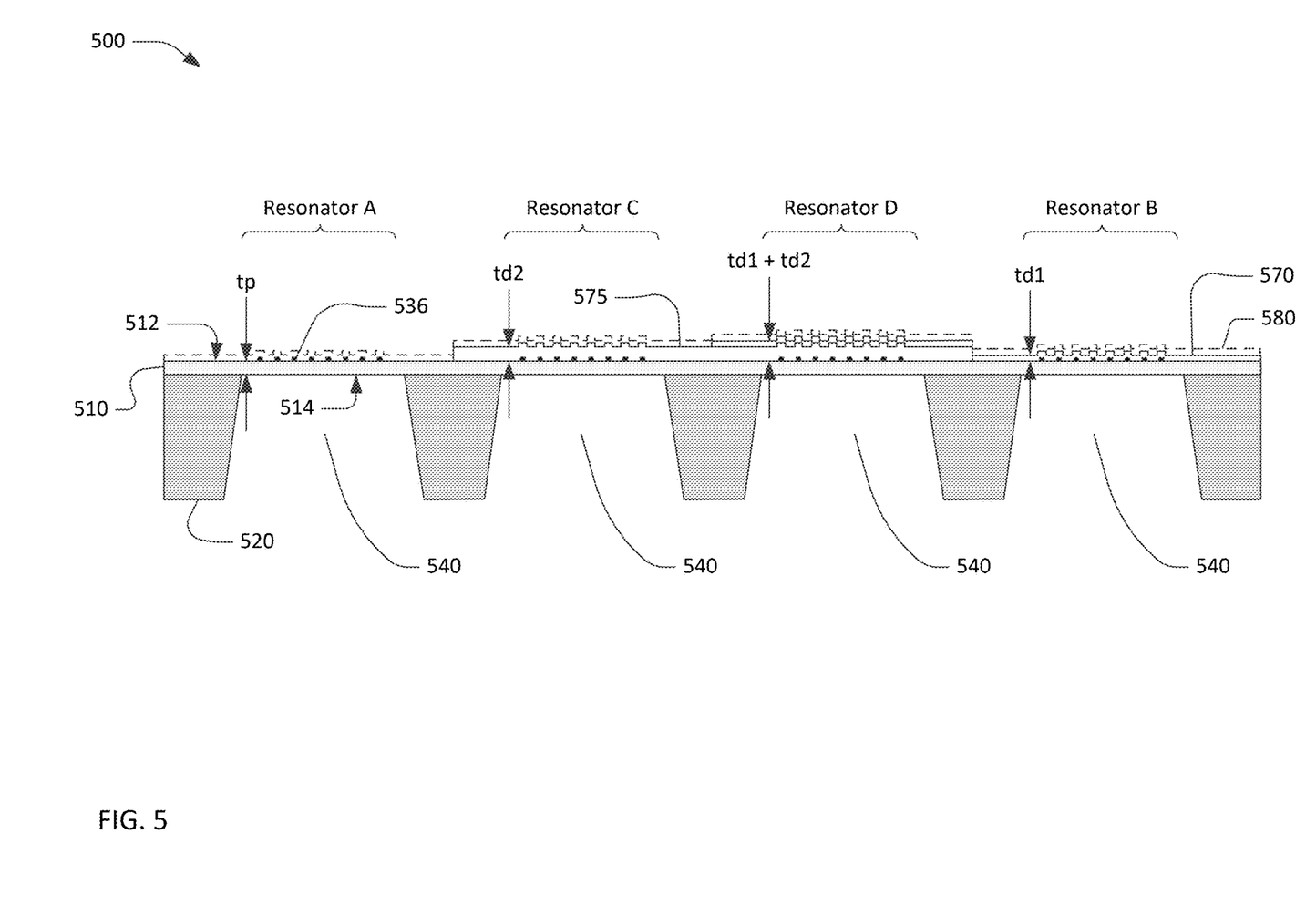
FIG. 5 is a schematic cross-sectional view of XBARs with multiple frequency setting dielectric layers.

FIG. 5 is a schematic cross-sectional view of an improved XBAR filter 500 that uses multiple frequency setting layers. The filter 500 includes four XBARs identified as Resonator A, Resonator B, Resonator C, and Resonator D. All four resonators are formed on a piezoelectric plate 510 attached to a substrate 520. Portions of the piezoelectric plate 510 are suspended over four cavities 540 formed in the substrate. While the four cavities 540 are shown extending through the substrate 520, the cavities may only extend through a portion of the thickness of the substrate as shown in FIG. 3. Each of the four resonators A-D includes respective IDT fingers, such as IDT finger 536 of resonator A, disposed on the top surface 512 of the piezoelectric plate over the respective cavities.

Resonator A does not include a dielectric frequency setting layer. In this case, the thickness of the diaphragm of resonator A is equal to the thickness tp of the piezoelectric plate 510. Resonator B has a first frequency setting layer 570 formed over the IDT fingers 530. The thickness of the diaphragm of resonator B is equal to tp plus the thickness td1 of the first frequency setting layer. Resonator C has a second frequency setting layer 575 formed over the IDT fingers 530. The thickness of the diaphragm of resonator C is equal to tp plus the thickness td2 of the second frequency setting layer.

The thickness td2 of the second frequency setting layer is greater than the thickness td1 of the first frequency setting layer. Resonator D includes both the first frequency setting layer 570 and the second frequency setting layer 575. The thickness of the diaphragm of resonator D is equal to tp+td1+td2. Since the resonant frequency of an XBAR is highly dependent on diaphragm thickness, the following relationships will usually hold:

$$f_A > f_B > f_C > f_D,$$

where $f_A$, $f_B$, $f_C$, and $f_D$ are the resonance frequencies of resonators A-D, respectively.

The first frequency setting layer 570 and the second frequency setting layer 575 may be silicon dioxide, silicon nitride, silicon oxynitride, aluminum oxide, or some other dielectric material with low acoustic loss. The first frequency setting layer 570 and the second frequency setting layer 575 are typically, but not necessarily, the same material. All or portions of the first frequency setting layer 570 and/or the second frequency setting layer 575 may be formed on the back surface 514 of the piezoelectric plate 510.

An optional thin dielectric passivation layer 580 (shown in dashed lines) may be applied over all of the resonators. If present, the thickness of the passivation layer 580 may be comparable to or less than the thickness td1 of the first frequency setting layer 570.

Figure 6:
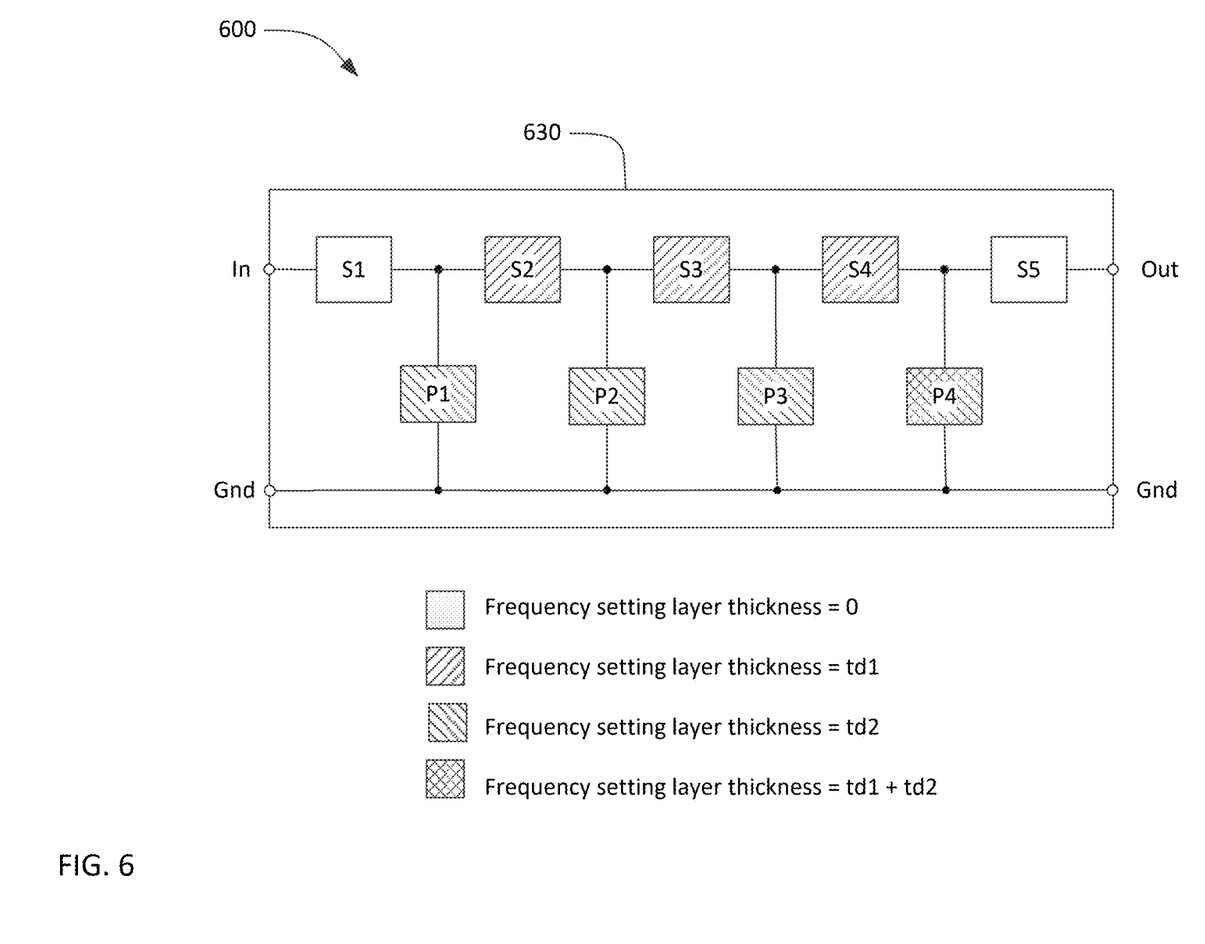
FIG. 6 is a schematic circuit diagram of a filter using XBARs with multiple frequency setting dielectric layers.

FIG. 6 is a block diagram of a bandpass filter 600 including five series resonators S1, S2, S3, S4, and S5 and four shunt (parallel) resonators P1, P2, P3, P4. The bandpass filter 600 is fabricated with two frequency setting layers. A first frequency setting layer having thickness td1 is provided on series resonators S2, S3, and S4 and shunt resonator P4. A second frequency setting layer having thickness td2, which is greater than td1, is provided on the shunt resonators P1 to P4. Series resonators S1 and S5 do not have a frequency setting layer. Shunt resonator P4 has both frequency setting layers.

The structure of series resonators S1 and S5 will be similar to that of Resonator A in FIG. 5. The structure of series resonators S2, S3 and S4 will be similar to that of Resonator B in FIG. 5. The structure of shunt resonators P1, P2, and P3 will be similar to that of Resonator C in FIG. 5. The structure of shunt resonator P4 will be similar to that of Resonator D in FIG. 5.

The inclusion of five series resonators and four shut resonators in the filter 600 is exemplary, as is the number of resonators that have none, one, or both of the frequency setting layers. In general, the first frequency setting layer will be formed over a first subset of the total number of resonators and the second frequency setting layer will be formed over a second subset of the total number of resonators. In this context, the word "subset" has its conventional meaning of "some but not all". The first and second subsets will not be identical. One or more resonators (e.g. resonator P4 in this example) may belong to both subsets and thus receive both the first and second frequency setting layers. One or more resonators (S1 and S5 in this example) may not belong to either subset. In addition to the first and second frequency setting layers, a passivation layer may be applied over all resonators.

Figure 7:
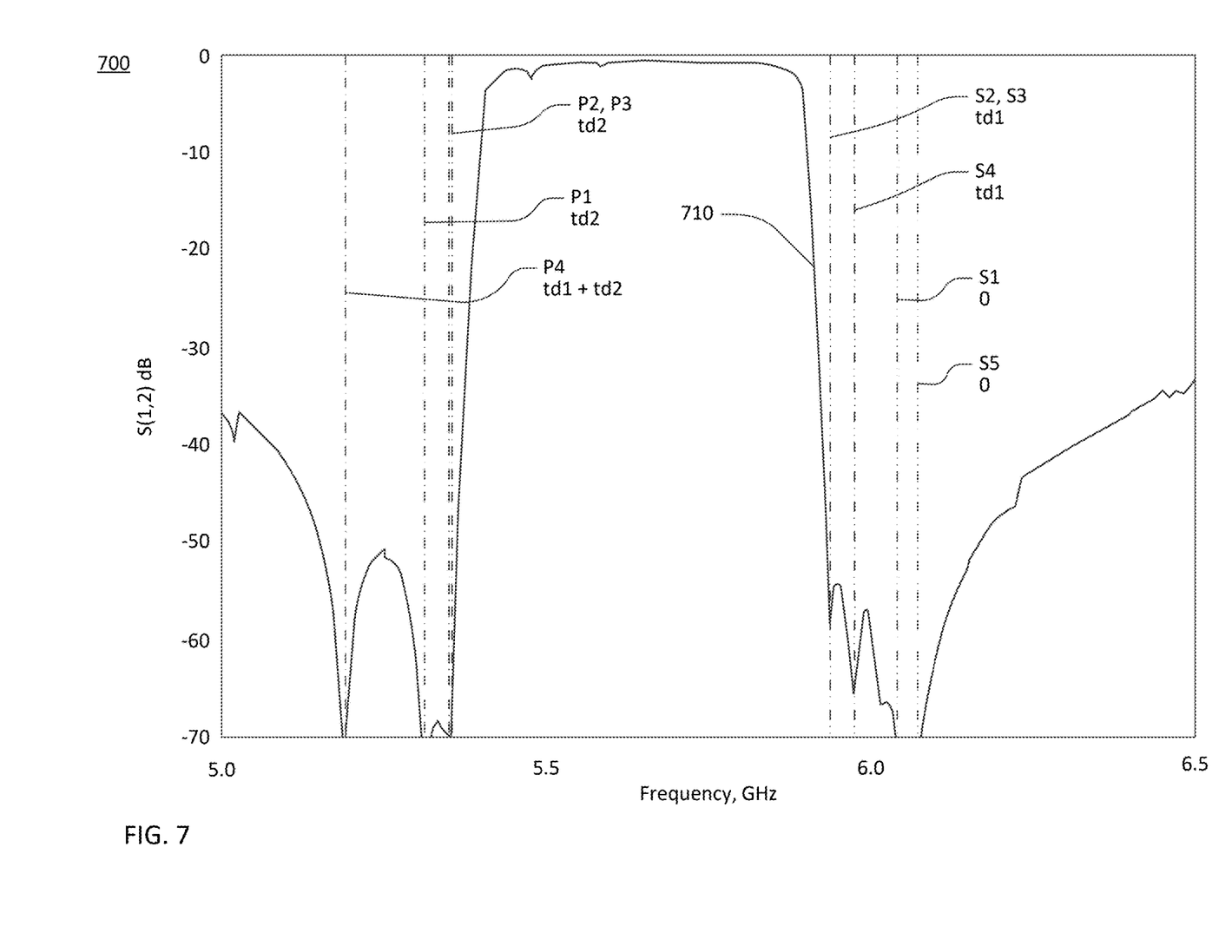
FIG. 7 is a graph of the input-output transfer function (S21) of an embodiment of the filter of FIG. 5.

FIG. 7 is a chart showing results from simulating an embodiment of the filter of FIG. 6. The performance of the filter was simulated using a 3D finite element modeling tool. The curve 710 is a plot of the magnitude of S21, the input-output transfer function, of the filter as a function of frequency. The dot-dash vertical lines represent the transmission zeros at or near the resonance frequencies of the shunt resonators P1, P2, P3, and P4. The dot-dot-dash vertical lines represent the transmission zeros at or near the anti-resonance frequencies of the series resonators S1 to S5. Each of these lines is labeled with the corresponding resonator designator and the thickness of the respective frequency setting dielectric layer.

Figure 8:
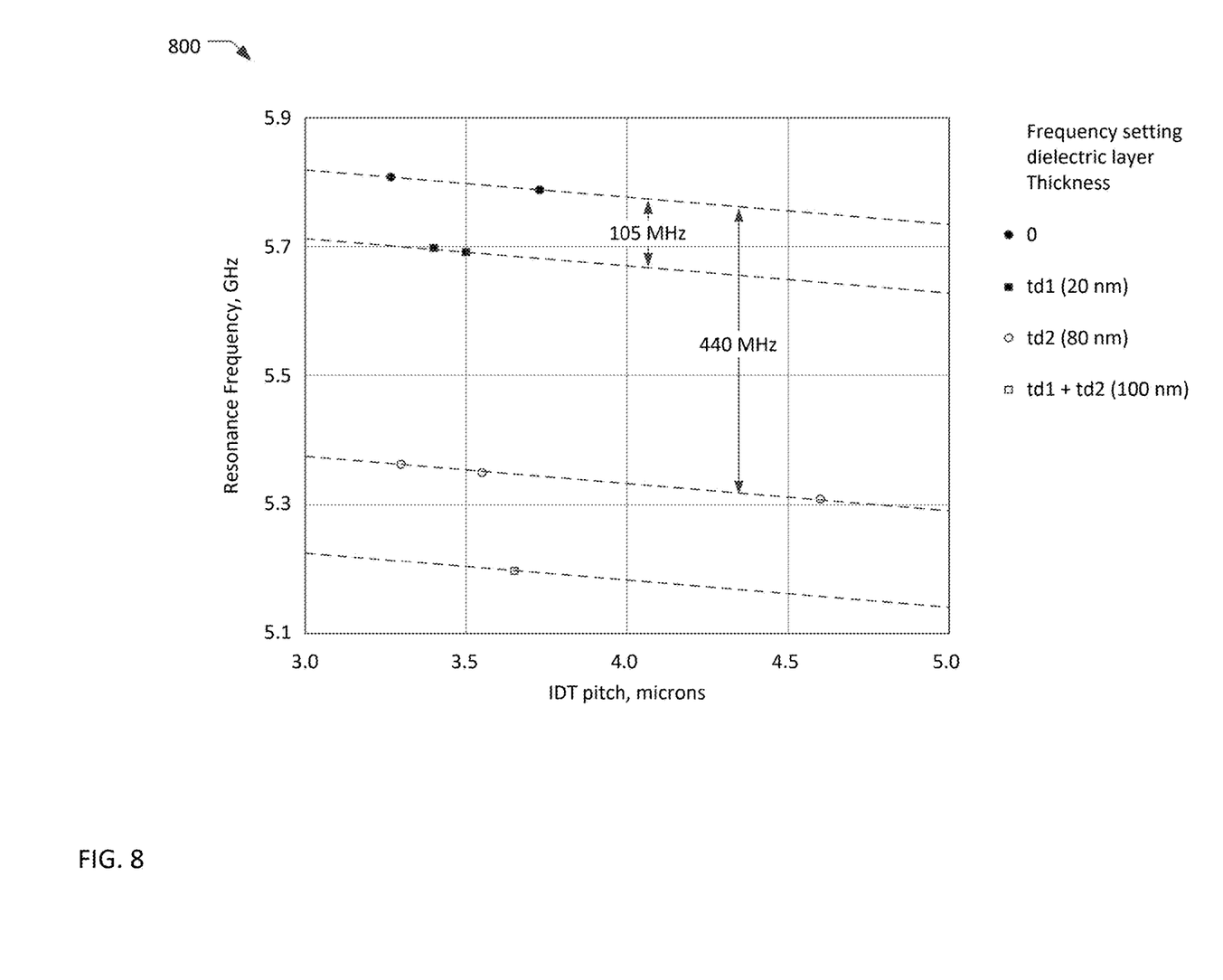
FIG. 8 is a graph of resonance frequency as a function of IDT pitch and frequency setting dielectric layer thickness.

The effect of frequency setting dielectric layers can be understood through consideration of FIG. 8. FIG. 8 is a graph 800 of the resonance frequencies of the XBARs in the filter 600 of FIG. 6 as a function of IDT pitch. Solid circles represent resonators without a frequency setting dielectric layer. Solid squares represent resonators with the first frequency setting dielectric layer with thickness td1. Open circles represent resonators with the second frequency setting dielectric layer with thickness td2. The open square represents the resonator with both the first and second frequency setting dielectric layers with a total thickness of td1+td2. In this example td1=20 nm and td2=80 nm. The dashed lines represent the approximate relationships between resonance frequency and IDT pitch for the various dielectric layer thicknesses.

Resonance frequency has a roughly linear dependence on IDT for the IDT pitch range of 3 to 5 microns. However, the dependence is weak, with a 50% change in IDT pitch resulting in roughly 2% change in resonance frequency. Resonance frequency has a stronger dependence on frequency setting dielectric layer thickness. For resonators having the same IDT pitch, the first frequency dielectric layer lowers resonance frequency by about 105 MHz compared to resonators with no dielectric layer. For resonators having the same IDT pitch, the second frequency dielectric layer lowers resonance frequency by about 440 MHz compared to resonators with no dielectric layer.

Description of Methods

Figure 9:
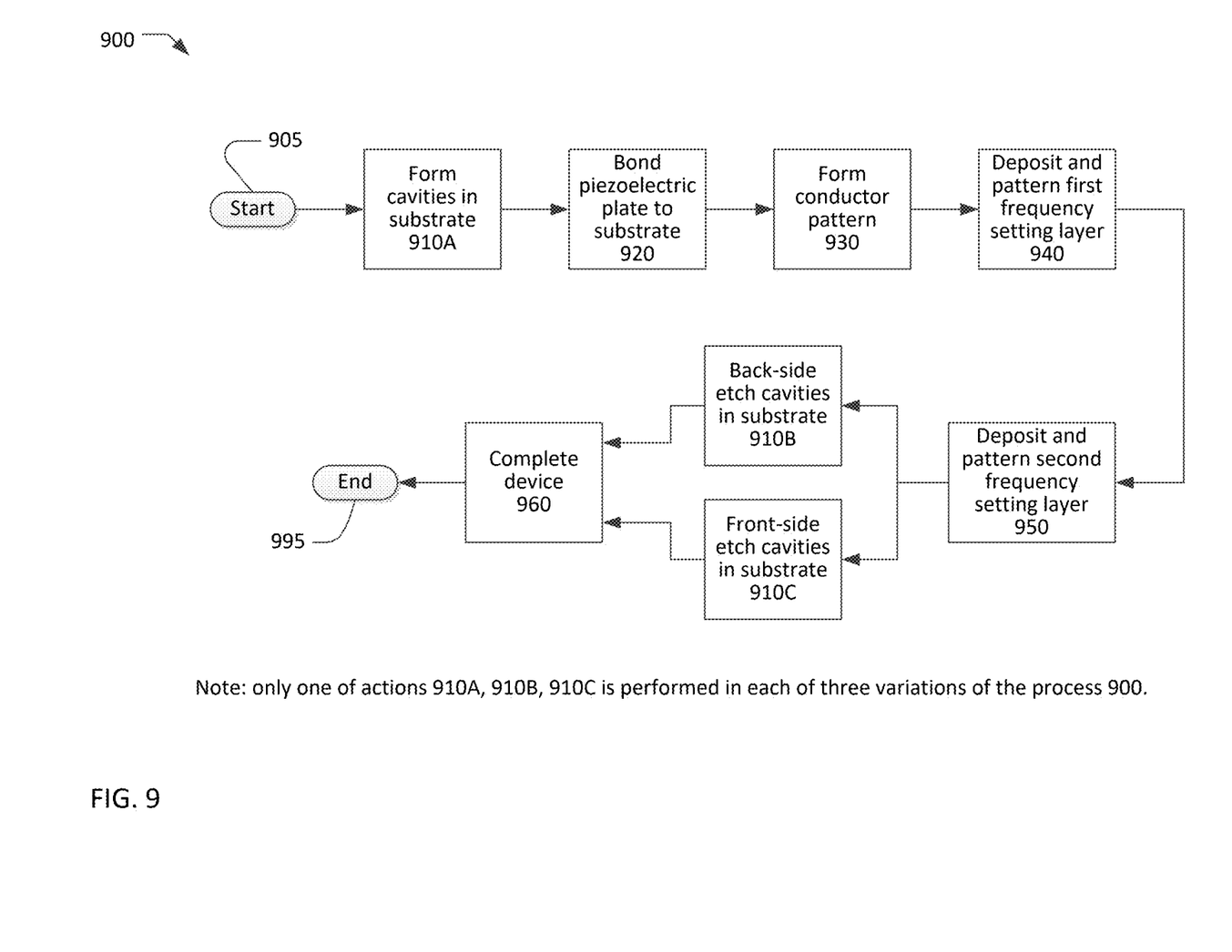
FIG. 9 is a flow chart of a process for fabricating a filter using XBARs with multiple frequency setting dielectric layers.

FIG. 9 is a simplified flow chart showing a process 900 for making an XBAR or a filter incorporating XBARs. The process 900 starts at 905 with a substrate and a plate of piezoelectric material and ends at 995 with a completed XBAR or filter. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

The flow chart of FIG. 9 captures three variations of the process 900 for making an XBAR which differ in when and how cavities are formed in the substrate. The cavities may be formed at steps 910A, 910B, or 910C. Only one of these steps is performed in each of the three variations of the process 900.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 900, one or more cavities are formed in the substrate at 910A before the piezoelectric plate is bonded to the substrate at 920. A separate cavity may be formed for each resonator in a filter device. The one or more cavities may be formed using conventional photolithographic and etching techniques. Typically, the cavities formed at 910A will not penetrate through the substrate, and the resulting resonator devices will have a cross-section as shown in FIG. 3.

At 920, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. The piezoelectric plate may be bonded to the substrate using some other technique.

A conductor pattern, including IDTs of each XBAR in the filter, is formed at 930 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 930 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 930 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 940, the first frequency setting dielectric layer may be formed by depositing a dielectric material on the front side of the piezoelectric plate. The first frequency setting dielectric layer may be deposited using a conventional deposition technique such as atomic layer deposition, physical vapor deposition, or chemical vapor deposition. One or more lithography processes (using photomasks) may be used to limit the first frequency setting dielectric layer to selected areas of the piezoelectric plate, such as only over the fingers of a first subset of IDTs. The thickness of the first frequency setting dielectric layer is td1.

At 950, the second frequency setting dielectric layer may be formed by depositing a dielectric material on the front side of the piezoelectric plate. The second frequency setting dielectric layer may be deposited using a conventional deposition technique such as atomic layer deposition, physical vapor deposition, or chemical vapor deposition. One or more lithography processes (using photomasks) may be used to limit the second frequency setting dielectric layer to selected areas of the piezoelectric plate, such as only over the fingers of a second subset of IDTs. The thickness of the second frequency setting dielectric layer is td2. Typically, td2>td1.

In a second variation of the process 900, one or more cavities are formed in the back side of the substrate at 910B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 900, one or more cavities in the form of recesses in the substrate may be formed at 910C by etching the substrate using an etchant introduced through openings in the piezoelectric plate. A separate cavity may be formed for each resonator in a filter device. The one or more cavities formed at 910C will not penetrate through the substrate, and the resulting resonator devices will have a cross-section as shown in FIG. 3.

In all variations of the process 900, the filter device is completed at 960. Actions that may occur at 960 include depositing an encapsulation/passivation layer such as silicon oxide or silicon nitride over all or a portion of the device; forming bonding pads or solder bumps or other means for making connection between the device and external circuitry; excising individual devices from a wafer containing multiple devices; other packaging steps; and testing. Another action that may occur at 960 is to tune the resonant frequencies of the resonators within the device by adding or removing metal or dielectric material from the front side of the device. After the filter device is completed, the process ends at 995.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device, comprising:
a substrate;
a single-crystal piezoelectric plate having front and back surfaces, the back surface attached to a surface of the substrate, portions of the single-crystal piezoelectric plate forming one or more diaphragms spanning respective cavities in the substrate;
a conductor pattern formed on the front surface, the conductor pattern including a plurality of interdigital transducers (IDTs) of a plurality of resonators, interleaved fingers of each of the plurality of IDTs disposed on a respective diaphragm of the one or more diaphragms;
a first frequency setting dielectric layer having a first thickness disposed over the fingers of the IDTs of a first subset of the plurality of resonators; and
a second frequency setting dielectric layer having a second thickness greater than the first thickness disposed over the fingers of the IDTs of a second subset of the plurality of resonators, wherein the first subset and the second subset are not identical.

2. The filter device of claim 1, wherein the single-crystal piezoelectric plate and all of the IDTs are configured such that a respective radio frequency signal applied to each IDT excites a respective shear primary acoustic mode within the respective diaphragm.

3. The filter device of claim 1, wherein
the plurality of resonators includes two or more shunt resonators and two or more series resonators connected to form a ladder filter circuit, and
the second subset is all of the shunt resonators.

4. The filter device of claim 3, wherein the first subset includes at least one of the two or more series resonator.

5. The filter device of claim 3, wherein the first subset includes at least one of the two or more shunt resonators.

6. The filter device of claim 5, wherein the first subset includes at least one of the two or more series resonators.

7. The filter device of claim 1, wherein at least one resonator is not in either the first or second subsets.

8. The filter device of claim 1, wherein at least one resonator is in both the first and second sub sets.

9. The filter device of claim 1, further comprising a passivation layer disposed over all of the plurality of resonators.

10. A method of fabricating a filter device, comprising:
attaching a back surface of a single-crystal piezoelectric plate to a surface of a substrate such that portions of the single-crystal piezoelectric plate form one or more diaphragms spanning respective cavities in the substrate;
forming a conductor pattern on a front surface of the piezoelectric plate, the conductor pattern including a plurality of interdigital transducers (IDTs) of a plurality of resonators, interleaved fingers of each of the plurality of IDTs disposed on a respective diaphragm of the one or more diaphragms;
forming a first frequency setting dielectric layer having a first thickness over the fingers of the IDTs of a first subset of the plurality of resonators; and
forming a second frequency setting dielectric layer having a second thickness greater than the first thickness over the fingers of the IDTs of a second subset of the plurality of resonators, wherein the first subset and the second subset are not identical.

11. The method of claim 10, wherein the single-crystal piezoelectric plate and all of the IDTs are configured such that a respective radio frequency signal applied to each IDT excites a respective shear primary acoustic mode within the respective diaphragm.

12. The method of claim 10, wherein
the plurality of resonators includes two or more shunt resonators and two or more series resonators connected to form a ladder filter circuit, and
the second subset is all of the shunt resonators.

13. The method of claim 12, wherein the first subset includes at least one of the two or more series resonators.

14. The method of claim 12, wherein the first subset includes at least one of the two or more shunt resonators.

15. The method of claim 14, wherein the second subset includes at least one of the two or more series resonators.

16. The method of claim 10, wherein at least one resonator is not in either of the first and second subsets.

17. The method of claim 10, wherein at least one resonator is in both the first and second subsets.

18. The method of claim 10, further comprising depositing a passivation layer over all of the plurality of resonators.

* * * * *